United States Patent [19]

Noguchi

[11] Patent Number: 4,960,725

[45] Date of Patent: Oct. 2, 1990

[54] SEMICONDUCTOR DEVICE AND MANUFACTURING PROCESS FOR PROVIDING DEVICE REGIONS ON THE SEMICONDUCTOR DEVICE AND ISOLATION REGIONS TO ISOLATE THE DEVICE REGIONS FROM EACH OTHER.

[75] Inventor: Tatsuo Noguchi, Yokohama, Japan

[73] Assignee: Kabushiki Kaisha Toshiba, Kawasaki, Japan

[21] Appl. No.: 222,314

[22] Filed: Jul. 19, 1988

Related U.S. Application Data

[62] Division of Ser. No. 910,684, Sep. 23, 1986, abandoned.

[30] Foreign Application Priority Data

Sep. 25, 1985 [JP] Japan ................................ 60-211557

[51] Int. Cl.[5] ...................... H01L 21/00; H01L 29/84

[52] U.S. Cl. ........................................ 437/57; 437/63; 437/70

[58] Field of Search ....................... 437/57, 63, 56, 58, 437/70

[56] References Cited

U.S. PATENT DOCUMENTS

| | | | |
|---|---|---|---|
| 3,400,310 | 9/1968 | Dorendorf et al. | 317/234 |
| 4,290,078 | 9/1981 | Ronen | 357/41 |
| 4,385,947 | 5/1983 | Halfacre et al. | 148/187 |
| 4,442,529 | 4/1984 | Ahuja et al. | 357/84 |
| 4,574,467 | 3/1986 | Halfacre et al. | 437/57 |

FOREIGN PATENT DOCUMENTS

| | | |
|---|---|---|
| 1514398 | 9/1969 | Fed. Rep. of Germany . |
| 59-145352 | 7/1984 | Japan . |
| 59-275952 | 12/1984 | Japan . |

*Primary Examiner*—Olik Chaudhuri
*Assistant Examiner*—George R. Fourson
*Attorney, Agent, or Firm*—Foley & Lardner, Schwartz, Jeffery, Schwaab, Mack, Blumenthal & Evans

[57] ABSTRACT

There is provided a semiconductor device which comprises device regions and isolation regions to isolate the device regions from each other on a semiconductor substrate, wherein field insulators are formed in the isolation regions and conduction layers for wiring are formed above the field insulators. An additional impurity buried layer having an opposite conductivity to the semiconductor substrate is formed under the field insulators. Therefore the first capacitance element is composed of the conductive layer, the impurity buried layer, and the field insulator therebetween. The second capacitance element is composed of the impurity buried layer, the semiconductor substrate, and a PN junction layer therebetween. Thus the first capacitance element and the second capacitance element are connected in series.

1 Claim, 2 Drawing Sheets

Y X Y X Y
8 9 4 10
7 N+ N+ P+ P+
2 3 7 N-Well 11 6 N-Well 5
P-Sub 1

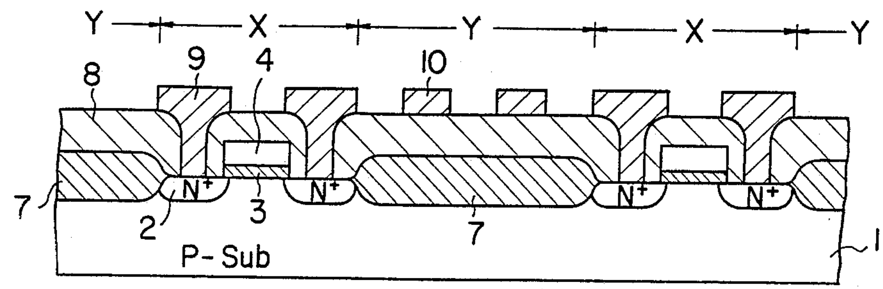
F I G. 1 (a)
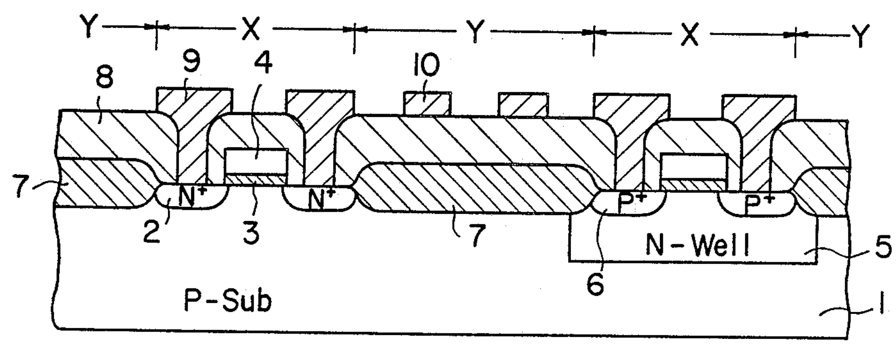
F I G. 1 (b)
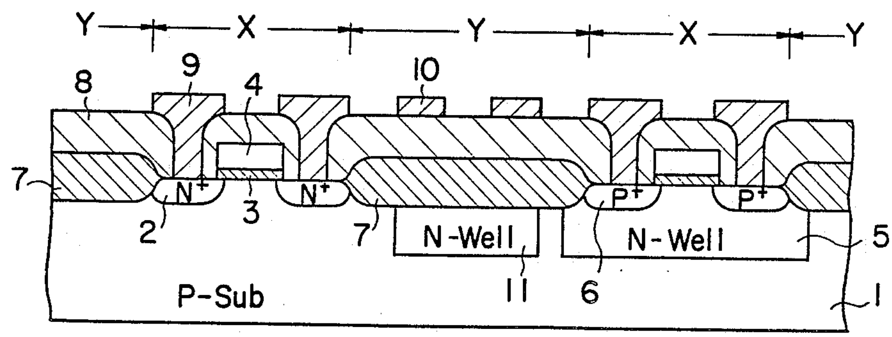
F I G. 2

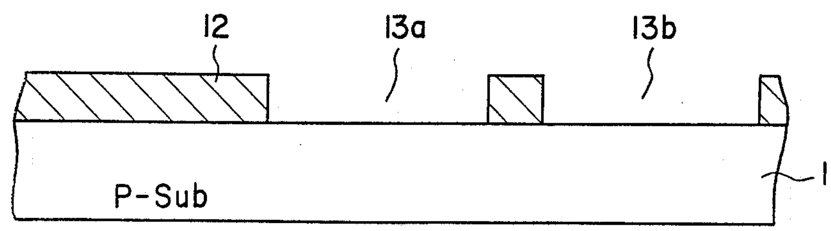
F I G. 3(a)
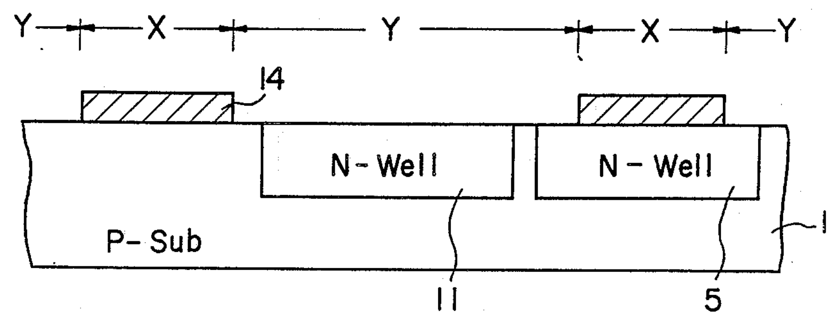
F I G. 3(b)
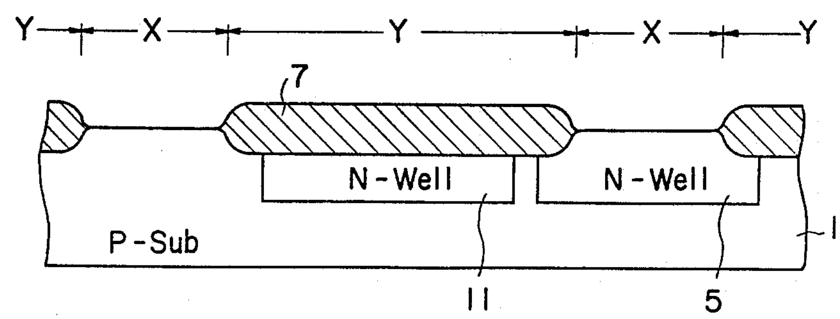
F I G. 3(c)

SEMICONDUCTOR DEVICE AND MANUFACTURING PROCESS FOR PROVIDING DEVICE REGIONS ON THE SEMICONDUCTOR DEVICE AND ISOLATION REGIONS TO ISOLATE THE DEVICE REGIONS FROM EACH OTHER.

This application is a division of application Ser. No. 910,684 filed Sept. 23, 1986 now abandoned.

BACKGROUND OF THE INVENTION

This invention relates to a semiconductor device and, more particularly, to a semiconductor device in which a reduction of a parasitic capacitance between a substrate and a conductive layer utilized for wiring is needed in order to improve the operation speed.

FIG. 1 illustrates a structure of a general MOS (Metal Oxide Semiconductor) transistor device according to the prior art. FIG. 1(*a*) is a sectional view of an N channel transistor device and FIG. 1(*b*) is a sectional view of a CMOS (Complimentary Metal Oxide Semiconductor) transistor device. In both the devices, device regions X and isolation regions Y are defined on a P-type substrate 1. In the device region X of the device shown in FIG. 1(*a*), an N channel MOS transistor is constructed which comprises an N+-buried layer 2 (a layer implanted with an N+-type impurity), a gate oxide 3, and a gate electrode 4. On the other hand, in the device region X of the device shown in FIG. 1(*b*), a P channel MOS transistor is constructed in an N-well 5 as well as an N channel MOS transistor. The P channel MOS transistor comprises a P+-buried layer 6, a gate oxide 3, and a gate electrode 4. In order to isolate these device regions X, field oxides 7 are constructed in the isolation regions Y. The transistors and the field oxides 7 are coated with insulative protection layers 8. After forming contact windows, interconnection layers 9 are formed through protection layers 8. Then conductive layers 10 are formed on the protection layers 8 in the isolation regions Y so as to wire the transistors.

In the operation mode of the above described MOS transistors, it is considered that there are three different types of capacitance elements which behave as loads in a circuit, that is, (i) a junction capacitance between the substrate 1 and the N+-buried layer 2 which corresponds to a source or a drain; (ii) a capacitance between the gate 4 and the substrate 1; and (iii) a capacitance between the substrate 1 and the conductive layer 10. When the size of a transistor becomes smaller due to an integration of an LSI, the above mentioned capacitances (i) and (ii) are reduced. However, the capacitance (iii) tends to increase because the integration of the LSI lengthens the conductive layer and increases the thickness of the field oxides. Since the capacitance behaves as a load in a circuit, an operation speed of the circuit becomes low with increasing capacitance. Therefore the increase in the capacitance described above causes a serious problem in the LSI.

SUMMARY OF THE INVENTION

An object of the present invention is to provide a semiconductor device which can operate at a high speed by reducing a circuit load caused by a wiring capacitance.

The foregoing object is accomplished by providing a semiconductor device in which device regions and isolation regions adapted to isolate the device regions from each other are defined on a surface of a semiconductor substrate, and which comprises field insulators formed in the isolation regions and conductive layers for wiring formed above the field oxides, characterized by comprising an impurity buried layer having an opposite conductivity to the semiconductor substrate under the field insulators, so as to form a first capacitance element composed of the conductive layer, the impurity buried layer, and the field insulator therebetween, and a second capacitance element composed of the impurity buried layer, the semiconductor substrate, and a PN junction layer therebetween, the first capacitance element and the second capacitance element being connected in series so that a circuit load based on the wiring capacitance can be reduced and the circuit can operate with a high speed.

BRIEF DESCRIPTION OF THE DRAWINGS

In the accompanying drawings:

FIG. 1(*a*) is a cross sectional view of an N channel MOS transistor device according to the prior art;

FIG. 1(*b*) is a cross sectional view of a CMOS transistor device according to the prior art;

FIG. 2 is a cross sectional view of an embodiment of CMOS transistor device according to this invention; and FIGS. 3(*a*)–(*c*) are cross sectional views showing a manufacturing process of a CMOS transistor device according to this invention.

DETAILED DESCRIPTION OF THE PREFERRED EMBODIMENT

Referring to FIGS. 2 and 3, a preferred embodiment of this invention will be described in detail. FIG. 2 shows a structure of a CMOS transistor according to the invention as an embodiment, where the same elements as shown in FIG. 1 are indicated by the same reference numerals. An element added to the device shown in FIG. 1 is an N-well 11 which is an impurity buried layer having an opposite conductivity to the substrate 1 and is formed under the field oxide 7. In a CMOS device, another N-well 5 is formed in the device region X. The N-well 11 in the isolation region Y need not have the same impurity concentration, depth and width as those of the N-well 5. It is preferable to isolate the N-well 11 from the N-well 5, N+-buried layer 2 or other layers in order not to fix the potential of the N-well 11.

In the above described structure, two capacitance elements are connected in series in the isolation region Y. The first capacitance element is composed of the conductive layer 10, the N-well 11, and the field oxide 7 therebetween, which corresponds to an intrinsic capacitance element caused by a wiring in the device according to the prior art. The second capacitance element is composed of the N-well 11, the substrate 1, and the PN junction layer therebetween, which is connected in series to the first capacitance element. Since the second capacitance element is connected in series to the first capacitance element, a total circuit load caused by a wiring capacitance is reduced from that of the prior device. For example, when the capacitance value of the second capacitance element is equal to that of the first capacitance element, the capacitance value of the total wiring capacitance becomes half that of the prior device.

FIG. 3 shows a manufacturing process of the CMOS transistor device described in FIG. 2. First of all, as is shown in FIG. 3(*a*), a photoresist layer 12 is coated on a semiconductor substrate 1 and windows 13*a* and 13*b* are opened by a photo etching process in the regions where wells are to be formed later. In other words, the window 13*a* is located in a region corresponding to an N-well 11 and the window 13*b* is located, in a region corresponding to an N-well 5. Then an impurity having an opposite conductivity to the substrate 1, for example phosphor, is implanted into the substrate 1 using the photoresist layer 12 as a mask. Next, the impurity is diffused by thermal treatment so as to form an N-well 11 and an N-well 5 with a predetermined concentration of an impurity and a predetermined depth as is shown in FIG. 3(*b*). After removing the photoresist layer 12, oxidation protecting layers 14, such as silicon nitride layers, are formed in only the device region X on the substrate 1 by a photo etching process. By selective oxidation of the exposed surface of the substrate, which belongs to the isolation region Y, a field oxide 7 is formed as is shown in FIG. 3(*c*). Then the succeeding processes to construct a MOS transistor in the device region X are taken place in the same manner as in the prior method.

Since the N-well 11 and the N-well 5 can be simultaneously formed in the same process, the producing method according to this invention can be carried out with the same steps as the prior method. It is not required to form the N-well 11 under every field oxide 7. It is enough to simply form the N-well 11 in some broad isolation regions in which a conductive layer 10 utilized to form later a wiring. Especially, when the N-well 11 is formed in the specific region called "a critical path", in which a special high speed operation is required for a device, a remarkable effect can be expected.

The effect of the invention will be numerically considered as follows. In the prior device shown in FIG. 1(*b*), defining $W_L$ as the width of the wiring conductive layer 10, $\epsilon_{ox}$ as the dielectric constant of the field oxide 7 and $T_f$ as the sum of the thickness of the field oxide 7 and the thickness of the protection layer 8, then a wiring capacitance $C_L$ per unit length is approximately represented by eq. (1).

$$C_L = \frac{\epsilon_{ox} W_L}{T_f} \qquad (1)$$

On the other hand, in the device shown in FIG. 2, that is, in the embodiment of this invention, defining $T_D$ as the thickness of the depletion layer caused by the PN junction between the N-well 11 and the substrate 1, $W_W$ as the width of the N-well 11 and $\epsilon_s$ as the dielectric constant of the semiconductor, then a capacitance $C_D$ of the depletion layer per unit length is represented by eq. (2).

$$C_D = \frac{\epsilon_s W_w}{T_D} \qquad (2)$$

Therefore the total wiring capacitance $C_T$ per unit length in the whole device shown in FIG. 2 is represented by eq. (3).

$$C_T = \frac{C_L \cdot C_D}{C_L + C_D} \qquad (3)$$

Actual values of wiring capacitances $C_L$ and $C_T$ are calculated as follows. For example, supposing that the impurity concentration in the substrate 1 is equal to $10^{15}\text{cm}^{-3}$ and that in the N-well 11 is equal to $10^{16\sim17}\text{cm}^{-3}$, then the thickness of the depletion layer $T_D$ becomes 1.2 μm. Thus substituting the value 1.2 μm into the variable $W_L$, using values of 0.8 μm as $T_f$ and 2 μm as $W_W$, which are typical values in a CMOS device, and substituting the actual values of dielectric constants in silicon oxide and silicon into $\epsilon_{ox}$ and $\epsilon_s$, respectively, the following results are obtained through the calculation using eqs. (1) ~ (3).

$C_L$ = 60 fF/mm, and $C_T$ = 40 fF/mm.

These results clearly show that the wiring capacitance in the device according to the invention shown in FIG. 2 becomes lower than that in the prior device shown in FIG. 1 by more than 30%.

As described above, according to this invention, since an additional capacitance element is connected in series to the intrinsic wiring capacitance element in a semiconductor device, the total wiring capacitance can be reduced and the operation speed can be improved.

What is claimed is:

1. A manufacturing process for a semiconductor device comprising CMOS transistor regions and isolation regions to isolate said CMOS transistor regions from each other on a semiconductor substrate, said process comprising the steps of:

forming a first impurity buried layer in one of said CMOS transistor regions of said semiconductor substrate;

forming a second impurity buried layer in one of said isolation regions of said semiconductor substrate so that said first and second impurity buried layers are isolated from each other, said first and second impurity buried layers having an opposite conductivity type to said semiconductor substrate;

forming a field insulator on said second impurity buried layer in said one of said isolation regions;

forming individual integrated layers in order to constitute respective CMOS transistors in said CMOS transistor regions; and forming a conductive layer for wiring said individual integrated layers on said field insulator.

* * * * *